United States Patent [19]

O'Neill

[11] Patent Number: 5,686,224

[45] Date of Patent: Nov. 11, 1997

[54] INK JET PRINT HEAD HAVING CHANNEL STRUCTURES INTEGRALLY FORMED THEREIN

[75] Inventor: James F. O'Neill, Penfield, N.Y.

[73] Assignee: Xerox Corporation, Stamford, Conn.

[21] Appl. No.: 504,202

[22] Filed: Jul. 19, 1995

Related U.S. Application Data

[62] Division of Ser. No. 130,925, Oct. 4, 1993, abandoned.

[51] Int. Cl.$^6$ .................................................. G03F 7/20
[52] U.S. Cl. .................... 430/320; 430/324; 430/328; 430/330; 430/396
[58] Field of Search .............................. 430/5, 311, 315, 430/322, 324, 330, 316, 320, 328, 394, 396

[56] References Cited

U.S. PATENT DOCUMENTS 4,698,645  10/1987  Inamoto ........................... 346/140 R
5,486,449  1/1996  Hosono ............................... 430/328

*Primary Examiner*—Kathleen Duda

[57] ABSTRACT

A plurality of a thermal ink jet printheads are fabricated from a heater wafer, on which a plurality of arrays of heaters, transducers and addressing logic are located on one surface thereof, by depositing multiple coatings of a positive photoresist over the heater wafer to achieve a desired thickness and then exposing to the photoresist UV (ultra violet) light through a graded mask. The mask controls the depth of developed resist and concurrently forms a variable depth profile for the ink channel structures containing ink flow channels, reservoirs, and heater pits in a single step. A flat glass substrate with ink inlets formed therein is mated to the patterned photoresist to complete the wafer/substrate pair containing the plurality of printheads. The individual printheads are obtained by a subsequent dicing operation. In an alternate embodiment, a negative acting positive photoresist is used.

1 Claim, 7 Drawing Sheets

INK JET PRINT HEAD HAVING CHANNEL STRUCTURES INTEGRALLY FORMED THEREIN

This is a division of application Ser. No. 08/130,925, filed Oct. 4, 1993, now abandoned.

BACKGROUND OF THE INVENTION

The present invention relates to a thermal ink jet (TIJ) printhead and method of fabrication therefor, and more particularly to an improved TIJ printhead having ink flow directing structures such as channels, reservoirs and heater pits integrally formed on the substrate of the printhead containing the selectively addressable heating elements.

In existing well known thermal ink jet printing systems, an ink jet printhead expels ink droplets on demand by the selective application of a current pulse to a thermal energy generator, usually a resistor, located in capillary-filled, parallel ink channels a predetermined distance upstream from the channel nozzles or orifices. U.S. Pat. Nos. Re. 32,572; 4,947,192; 5,010,355 and 5,075,250 to Hawkins et al. exemplify such a thermal ink jet printhead and several fabricating processes therefor. In this fabrication technique, each printhead is composed of two parts that are aligned and bonded together. One part is a substantially flat substrate which contains on the surface thereof a linear array of heating and addressing elements (heater plate), and the second part is a substrate having at least one recess anisotropically etched therein to serve as an ink supply reservoir (channel plate) when the two parts are bonded together. A linear array of parallel grooves are also formed in the second part, so that one end of the grooves communicate with the manifold or reservoir recess and the other ends are open for use as ink droplet expelling nozzles. Many printheads can be made simultaneously by producing a plurality of sets of heating element arrays with their addressing elements on a silicon wafer and by mating a second silicon wafer having a corresponding plurality of sets of channel grooves and associated manifolds therein. After the two wafers are aligned and bonded together, the mated wafers are diced into many separate printheads.

Another example of a TIJ printing system is disclosed in U.S. Pat. Nos. 4,438,191; 4,894,664; and 5,016,024. In particular, U.S. Pat. No. 5,016,024 discloses an integral ink jet printhead that combines the separate elements of previous designs into one unit having many ink jets on one ink jet printhead, and U.S. Pat. No. 4,894,664 discloses a monolithic TIJ printhead having a nozzle on top of resistors constructed using a nickel-plating process, thereby eliminating adhesion and alignment problems. A further example of a TIJ printing system is disclosed in U.S. Pat. Nos. 4,394,670; 4,392,907; 5,059,973; 5,140,345 and 5,148,193. In particular, U.S. Pat. No. 5,059,973, discloses a TIJ printhead having a main body bonded to a discharge port plate, through which the discharge port is located. Another TIJ printing system includes, the TIJ printhead disclosed in U.S. Pat. No. 4,937,597, having a cavity plate, a nozzle plate and a vibration plate. Additionally an ink distribution plate may be interposed between the cavity plate and the nozzle plate. The plates are superposed on each other to form an integral body which constitutes the printhead. A further example of a method for fabricating a TIJ printing system is disclosed in U.S. Pat. No. 4,915,718. The disclosed method exposes photoform glass in a two-step acid etching process to form ink chambers at a greater depth than either ink inlets or ink nozzles.

Improvements to two part thermal ink jet printheads include U.S. Pat. No. 4,638,337 to Torpey et al. that discloses an improved printhead similar to that of U.S. Pat. No. Re. 32,572 to Hawkins et al, but has each of its heating elements located in a recess (termed heater pit). The recess walls containing the heating elements prevent lateral movement of the bubbles through the nozzle and therefore the sudden release of vaporized ink to the atmosphere, known as blow-out, which causes ingestion of air and interrupts the printhead operation whenever this event occurs. In this patent, a thick film insulative layer such as polyimide, Riston® or Vacrel® is formed on the wafer containing the heating elements and patterned to provide the recesses for the heating elements, so that the thick film layer is interposed between the two wafers when they are mated together. U.S. Pat. No. 4,774,530 to Hawkins further refines the two part printhead by disclosing an improvement over the patent to Torpey et al. In this patent, further recesses (termed bypass pits) are patterned in the thick film layer to provide a flow path for the ink from the manifold to the channels by enabling the ink to flow around the closed ends of the channels, thereby eliminating the fabrication steps required to open the groove closed ends to the manifold recess. The heater plates, having the aforementioned improvements of heater pits and bypass pits formed in the thick film insulative layer covering the heater plate surface, are aligned with and bonded to the channel plate, so that each channel groove has a recessed heating element therein and a bypass pit to provide an ink passage from the ink manifold to the channel groove.

Thorough bonding between heater and channel plates is paramount to maintaining the printing efficiency, droplet size consistency, and operational reliability of an ink jet printhead. U.S. Pat. No. 4,678,529 to Drake et al. discloses a method of bonding ink jet printhead components together by spin coating or spraying a relatively thin, uniform layer of adhesive on a flexible substrate and then manually placing the flexible substrate surface with the adhesive layer against the channel wafer surface having the etched sets of channel grooves. A uniform pressure and temperature is applied to ensure adhesive contact with all coplanar surface portions and then the flexible substrate peeled away, leaving a uniformly thin coating on the channel wafer surface to be bonded to the heater wafer. A more mechanized process to place the adhesive coating on the disk with the channel wafer minimizes operator involvement and consequent variation in parameters which may introduce thickness variations in the amount of adhesive layer transferred to the channel wafers, especially in the thickness variations from wafer-to-wafer. This process is described in U.S. patent application Ser. No. 07/888,220, to Narang et al, Filed May 26, 1992.

As is well known in the art, a plurality of printheads may be formed from the mating of two separate substrates or wafers, where one contains a plurality of arrays of heating elements and the other contains a plurality of arrays of ink channels or passageways. The wafer containing the ink channels is a silicon wafer, and the channels are formed by an anisotropic etching or orientation dependent etching (ODE) process as taught by U.S. Pat. Nos. 5,131,978; 5,096,535; 5,057,853 and 5,068,006. Before bonding and subsequent dicing into individual printheads, the two wafers are aligned. The silicon channel wafer is aligned with heater wafer using an infrared alignment technique that has an alignment accuracy on the order of five microns. When wafers are misaligned, problems such as dot spread and slanted printing may occur. After wafer alignment and bonding, misdirectionality problems may occur in each printhead when small chips or fragments enter the ink channels of the wafer during dicing of the front face of the channel plate. The low alignment accuracy tends to have a cumulative affect on the alignment accuracy of TIJ devices requiring high printhead resolution (e.g. spots per inch).

Although anisotropic etching or ODE has been shown to be a high yielding process which produces very planar and highly precise channel plates, the process has lower tolerances than other process such as developable photoresist. Generally, variations in etched patterns in silicon wafers are on the order of plus or minus one micron, while photoresist provide dimensional control on the order of one fourth of a micron. Latent image formation by patterning photoresist is well known and disclosed in the following: G. Talor, A. Gutmann, "Wide Latitude Image Reversal Process for 4M and 16M Drams", Microelectronic Engineering Vol. 9, Pg. 41 (1989); W. E. Feely, "Micro-Structures", THO215-4, Pg. 13 (1988); W. E. Feely, "3-D Latent Image in an Acid Hardening Resin", SPSE Photochemistry for Imaging Summer Symposium (ISBN 0-89208-140-6) Pg. 44 (Jun. 26, 1988); W. E. Feely, J. C. Imhof, C. M. Stein, "The Role of the Latent Image in a New Dual Image, Aqueous Developable, Thermally Stable Photoresist", Polymer Engineering and Science, Vol. 26, No. 16, Pg. 1101 (1986); W. E. Feely, "Microplastic Structures", SPIE Vol. 631, Pg. 48 (1986); W. Cordes III, D. Sawoska, A. Spencer, E. Turner, "EPA 914 IR—A Positive Resist with built-in Image Reversal Capabilities for ULSI Technology", SPIE Vol. 631, Advances in Resist Technology Processing III, Pg. 245 (1986).

The wafer containing the plurality of arrays of heating elements as well as heater addressing logic is covered by a thick film insulating layer (such as a polyimide) in which heater and bypass pits are formed using photolithography. One drawback with the polyimide material is its tendency to form unwanted topographical formations, such as raised edges or lips (1–3 microns high) at photoimaged edges. When bonding both heater and channel plates together, a standoff between the two plates may be created by the raised edges, which may reduce the adhesiveness of the bond between the two plates and which may cause the formation of interchannel gaps. Polyimide topography such as raised edges are undesirable by-products resulting from photoimaged and cured heater and bypass pits on heater plates. The raised edges are polyimide topographical features that are formed at the edge of photoimaged areas that can not shrink during curing as would bulk (or centered) areas of the polyimide. Consequently raised edges may critically interfere with the proximity at which heater and channel plates are bonded together. Raised edge polyimide topographic formations are, for example, a pronounced raised edge or lip formed at the outside edge of a large mass of polyimide such as the last pit in an array of pits.

Although advances have improved the thickness uniformity of the adhesive layer which bonds ink jet printhead heater and channel plates, insufficient adhesion between bonded heater and channel plates continues to cause a host of problems affecting printhead operation. Inter-channel gaps between bonded heater and channel plates must be minimized in order to insure consistent printhead firing characteristics (e.g., avoid different drop sizes between adjacent channels).

SUMMARY OF THE INVENTION

It is object of the present invention to provide a method of fabricating a TIJ printhead that does not require dicing the front face of a channel wafer, thereby eliminating the creation of chipped debris which clogs printhead channels and causes the printhead channels to have inconsistent firing characteristics.

It is another object of the invention to provide a more reliable printhead that avoids topographical formations in thick film insulative layers which weaken the bonds between mated wafers, thereby improving adhesion between wafers and consequently improves manufacturing quality and reliability.

It is yet another object of the invention to provide a method of printhead fabrication that is expandable to higher printhead resolutions and that uses alternate fabrication techniques which increase channel structure tolerances as well as the flexibility with which channel structures are formed, so as to overcome device resolution limitations imposed by the accuracy with which channel and heater plates can be aligned and fabricated.

To achieve the foregoing and other objects of the invention, and to overcome the shortcomings discussed above, an improved thermal ink jet printhead assembly is disclosed. The TIJ printhead assembly has channel structures of varying depths formed in a positive photoresist that has been coated on a lower substrate of the TIJ printhead assembly. The lower substrate has monolithically formed thereon an array of heating (e.g. active driver and resistive heater) and addressing elements. The photoresist is applied in multiple coatings to the lower substrate over the heating and addressing elements and has patterned therein ink channel structures of varying depths by exposing the photoresists through a graded mask. The channel structures include recesses which will serve as ink channels, heater pits and an ink manifold, each having different depths. The graded mask controls the depth of developed photoresist enabling a variable depth profile for the ink channels, heater pits, and ink supply manifold. The ink channels serve as ink passageways for conveying ink from the ink manifold or reservoir to the nozzles. Heater pits are disposed over the heating elements located in the channels a predetermined distance upstream from the nozzles. A glass plate with an etched ink inlet for each reservoir is bonded to the lower substrate to cover the channel structures in a manner that enables one ink inlet to communicate with a respective one of the ink manifolds or reservoirs. In an alternate embodiment, the printhead is formed without a glass plate using a negative acting positive photoresist.

Since the front face of the TIJ printhead is photolithographically defined, the printhead of the present invention has the advantage of having channel structures that are formed in a manner which does not require front face dicing of the printhead wafer as do silicon channel wafers. Additionally, the cross-sectional dimensions of the channel structures can be readily altered by either using different thicknesses of photoresist or by changing the dimension of the photopatternable mask, unlike ODE or anisotropic etching techniques. Furthermore, tolerances obtained using photolithographically defined channels structures are typically higher than ODE fabrication techniques. These higher tolerances enable the fabrication of higher resolution devices. Also, photoresist when applied in thicker coats can be expected to more readily achieve higher resolutions while maintaining high tolerances. Further advantages of using a photoresist to form channel structures instead of a channel plate exist. For example, photoresists are generally not known for generating large formations such as lips and dips formed in polyimide materials and would thus facilitate the bonding of the top plate to the printhead. Also, the edge bead problem encountered with bonding heater and channel plates with a polyimide layer therebetween is further minimized since the TIJ printhead channel structures are formed in a photoresist on the printhead and not a polyimide material.

Various of the above-mentioned and further features and advantages will be apparent from the specific apparatus and its operation described in the example(s) below, as well as the claims. Thus, a more complete understanding of the present invention can be obtained by considering the following detailed description in conjunction with the accompanying drawings, wherein like index numerals indicate like parts.

DESCRIPTION OF THE PREFERRED EMBODIMENT

Figure 1:
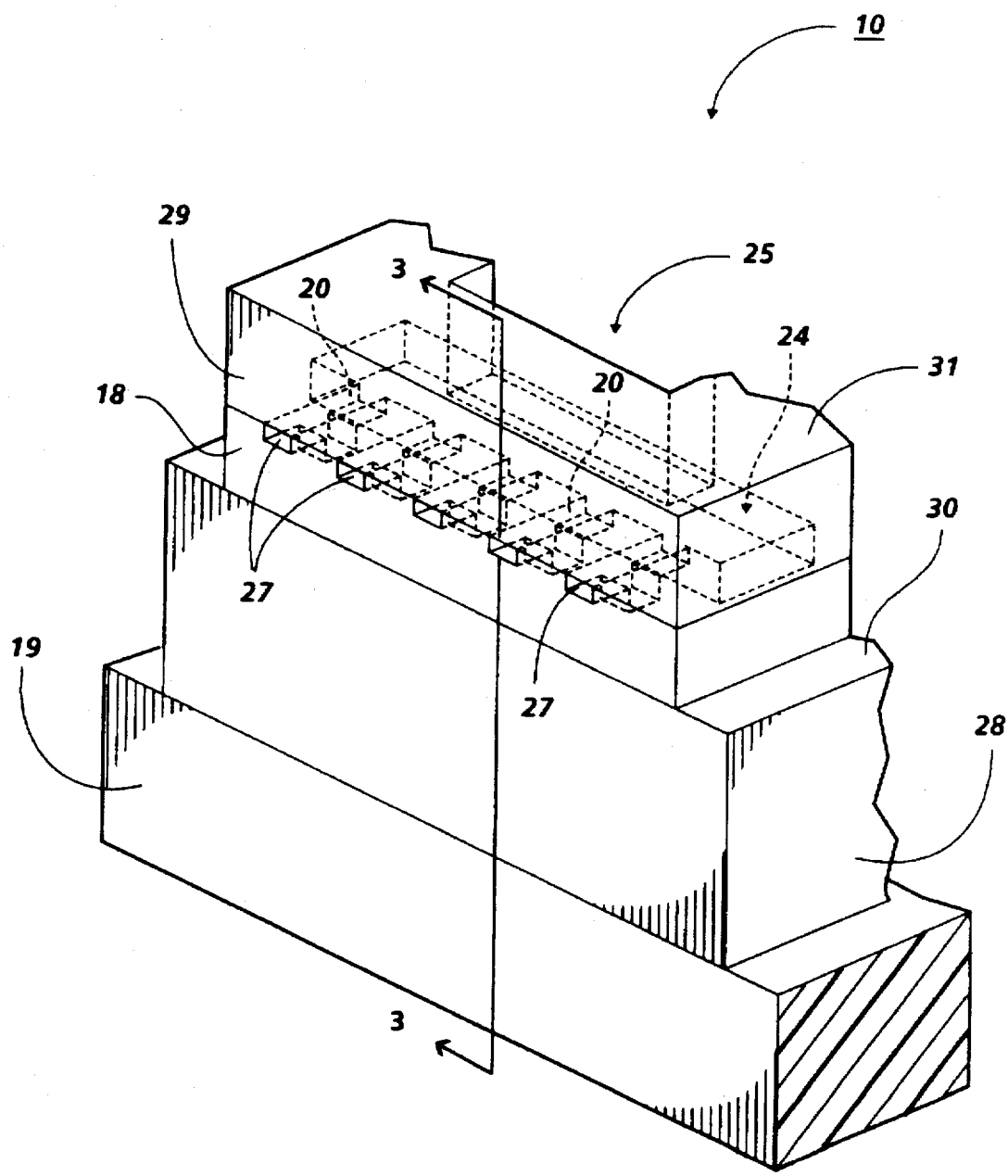
FIG. 1 is an enlarged, partially shown isometric view of a printhead incorporating the present invention.
Figure 2:
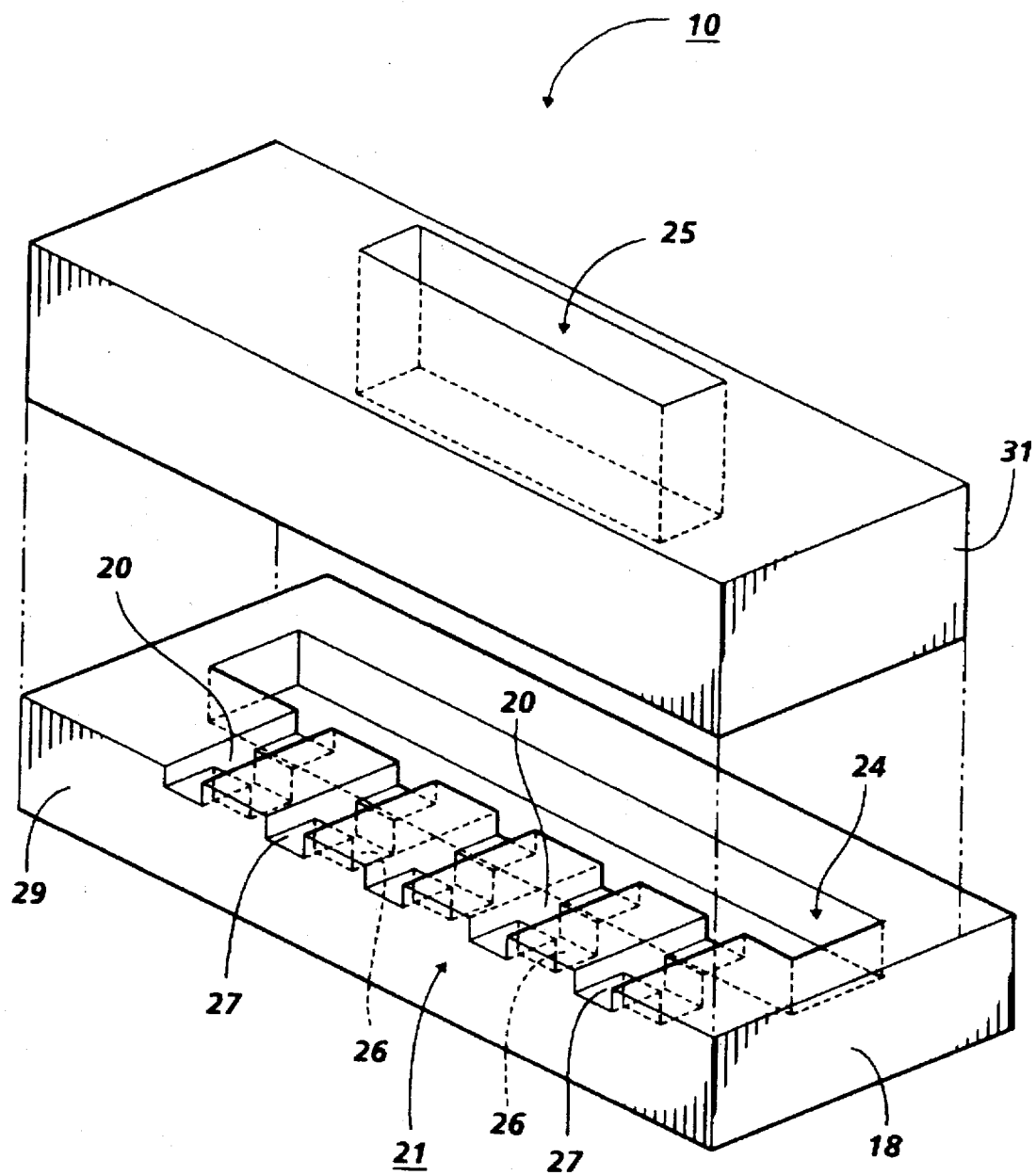
FIG. 2 is an enlarged exploded view of a portion of the printhead in FIG. 1, showing the upper substrate with ink inlet and ink flow structure patterned in the positive photoresist layer.
Figure 3:
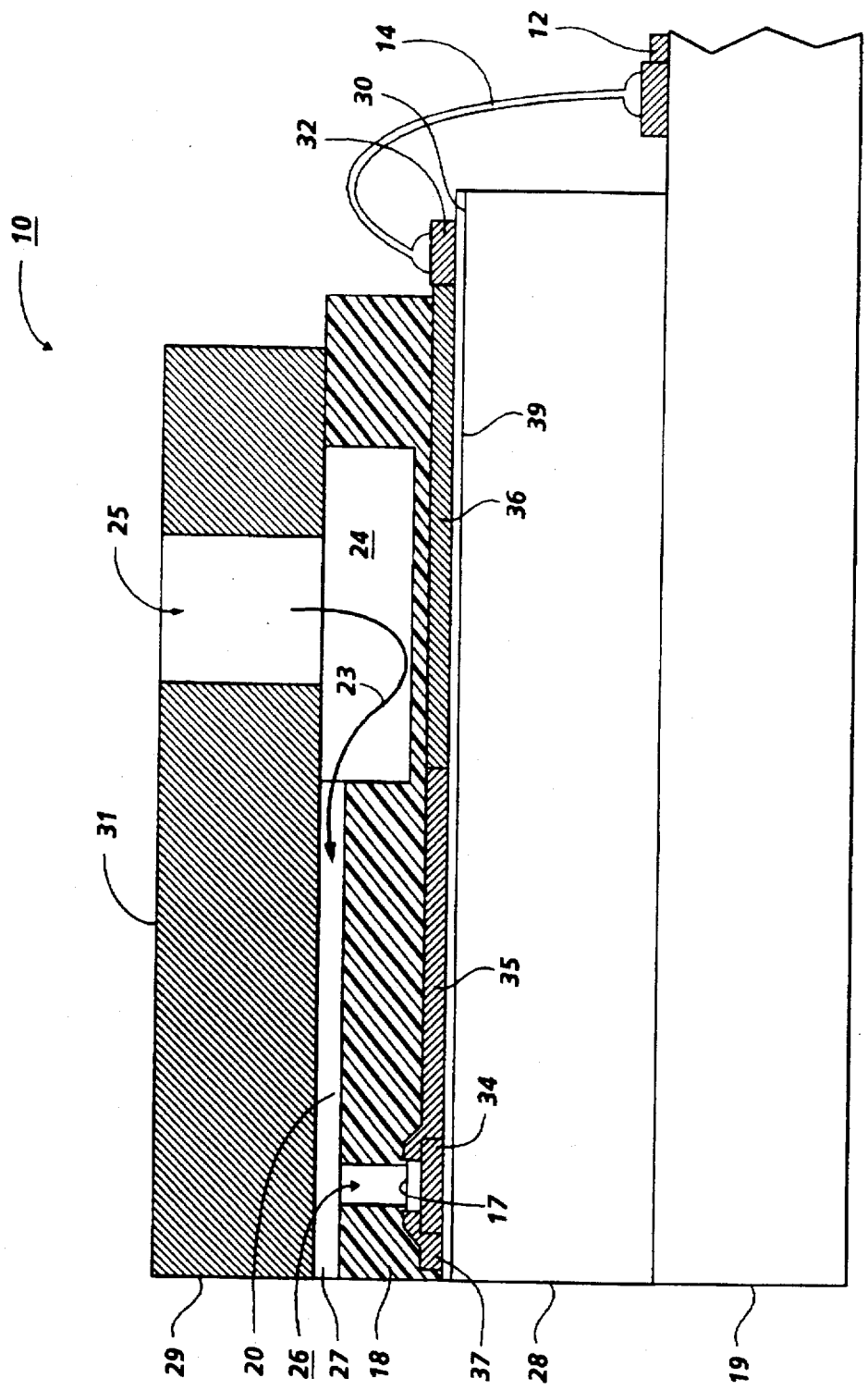
FIG. 3 is an enlarged cross-sectional view of FIG. 1 as viewed along the line 3—3 thereof.

In FIG. 1, an enlarged, partially shown schematic isometric view of printhead 10 incorporating the present invention is depicted. FIG. 3 presents a cross-sectional view of FIG. 1 as viewed along line 3—3 taken through one ink channel 20 (shown in dashed line). Additionally, FIG. 2 shows an enlarged exploded view of a portion of the printhead shown in FIG. 1, wherein the upper substrate 31 with the ink inlet 25 and the positive photoresist layer 18 with patterned ink-directing flow structures 21 is shown. Referring to FIGS. 1–3, the front face 29 of printhead 10 contains a row of droplet emitting nozzles 27 that are placed into communication with the ink supply reservoir by capillary ink channels 20. Ink (not shown) under a slight negative pressure enters through fill hole 25 in upper substrate or glass plate 31 to fill ink reservoir 24 in a patterned photoresist layer 18 applied to the surface 30 of lower substrate or heater plate 28. Optionally, the fill hole 25 may be relatively large so that the volume of the ink contained therein may be added to that of the reservoir 24 for additional ink supply capacity. By capillary action, ink fills channels 20 by flowing from the reservoir 24 as shown by directional arrow 23. Additionally, ink at each nozzle 27 forms a meniscus, the combination of negative ink pressure and surface tension of the meniscus preventing ink from weeping out of the ink channel nozzles.

In FIG. 3, the lower electrically insulating substrate or heating element plate 28 has transducer or resistor 34, MOS transistor switch or active drivers 35, common return 37 and addressing elements or logic circuitry 36 that are produced monolithically on underglaze insulating layer 39, such as silicon dioxide or silicon nitride, formed on heater wafer surface 30. The heating elements 34 are covered by protective layer 17, such as tantalum, to prevent cavitational damage to the heating elements caused by collapsing vapor bubbles when printhead 10 is operating. The printhead is mounted on daughterboard 19 and electrically connected to electrodes 12 thereon by wire bonds 14 by contact pads or electrical terminals 32 which connect to the logic circuitry 36. The daughterboard provides an interface with the printer controller (not shown) and power supplies (not shown). Fabricating resistor, transducer and logic elements on a monolithic silicon integrated circuit chip is well-known as disclosed in the following U.S Pat. Nos.: 4,532,530; Re. 32,572; 4,947,192 and 5,075,250 to Hawkins et al., the pertinent parts of which are herein incorporated by reference.

Figure 4:
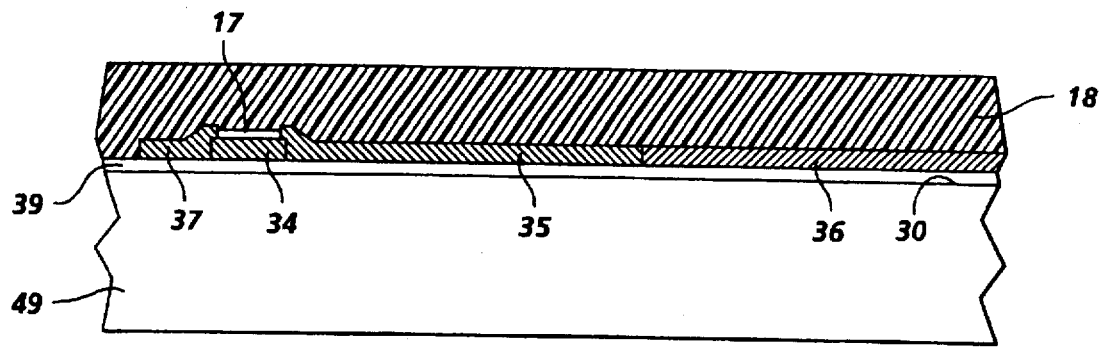
FIG. 4 is an enlarged cross-sectional view of a portion of the heater wafer with a positive photoresist applied thereto.

In the present invention, the ink flow directing structures 21, which comprise reservoir 24 and channels 20 having nozzles 27 and heater pits 26 are formed using the process sequence depicted in FIGS. 4–7, which is less complex than the process sequence disclosed in the aforementioned U.S. Patents. In the preferred embodiment, the process steps as disclosed in U.S. Pat. No. 5,075,250 and incorporated herein by reference are performed inclusively on surface 30 of heater wafer 49 shown in FIG. 4 to form the active drivers 35, logic circuitry 36, and heater resistive elements 34 until the step of depositing a thick film polyimide layer over all regions of the wafer is reached. Instead of depositing a polyimide layer, a photopatternable layer such as positive photoresist 18 is deposited. Initially, the heater wafer 49 has insulating or oxide layer 39 formed thereon as shown in FIG. 4. Subsequently, common return 37, resistor 34 with additional protective layer 17, active driver 35 and logic circuits 36 are formed using a well-known process sequence such as set forth in '2 by Hawkins et al. After cleaning wafer 49, passivation layers of $SiO_2$ and, optionally, $Si_3N_4$ (not shown) are deposited and patterned to expose the thermal transducers 34 and contact pads or terminals (not shown in FIG. 4) as taught by Hawkins et al. Next, multiple coatings of positive photoresist 18, such as Shipley Microposit 1375®, are applied over the passivated heaters, drivers and logic circuitry on oxide layer 39, which is deposited on surface 30 of heater wafer 49, until achieving the desired thickness of 30–35 microns. A slow heating process is used while forming the positive resist layer 18 in order to avoid the generation of bubbles produced when reactions occurring during the heating process release nitrogen gas. Gas bubbles are induced from nitrogen released within the resist layer 18 during exposure. Ideally after application, resist 18 is viscous and planar and has a uniform thickness of 30–35 microns.

Figure 5:
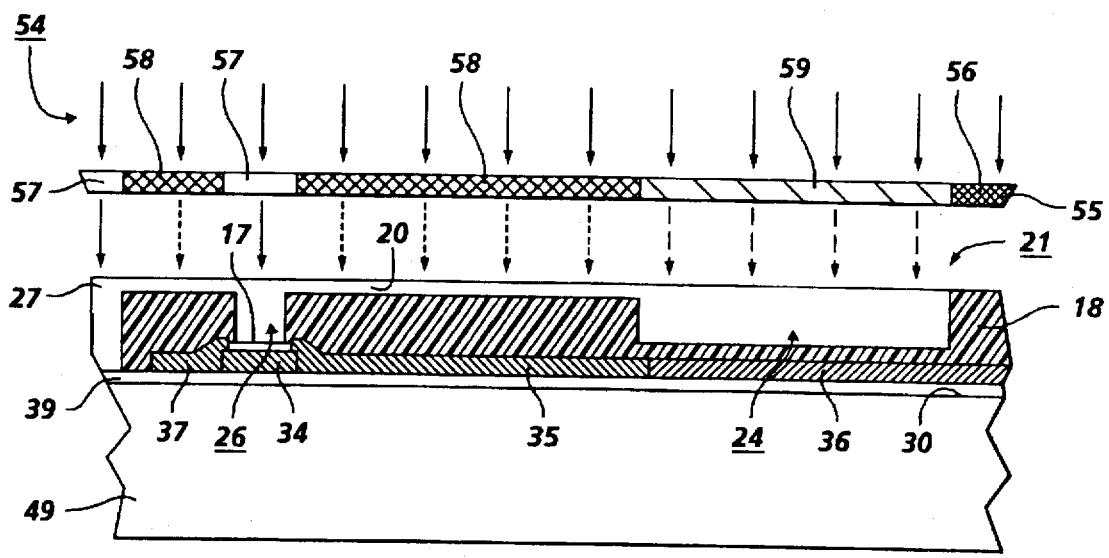
FIG. 5 is an enlarged cross-sectional view of a portion of the heater wafer shown in FIG. 4, showing the photoresist patterned using a graded or variable mask and then developed.

FIG. 5 shows positive photoresist 18 exposed to UV (ultra violet) light 54 through graded or variable mask 55. Graded mask 55 has a combination of opaque 56, clear 57 and variable areas 58 and 59. Variable area 58 is more opaque than variable area 59 and permits a smaller percentage of UV light transmission to reach resist 18 while clear area 57 allows full transmission and opaque area 56 allows no transmission of UV light to resist 18. Consequently, graded areas 58 and 59 of mask 55 control the depth at which resist 18 is developed by UV light 54 and thereby provides resist 18 with a profile having varying depth. After resist 18 is exposed to UV light and varying profile levels are formed, wafer 49 is immersed in developer, such as KTI 809®, to develop away exposed resist and thereby form ink flow directing structures 21, each having an array of ink channels 20 nozzles 27, reservoir 24, and heater pits 26. After developing resist 18, wafer 49 is optionally baked to further set the developed pattern and to insure adequate thermal stability.

Figure 6:
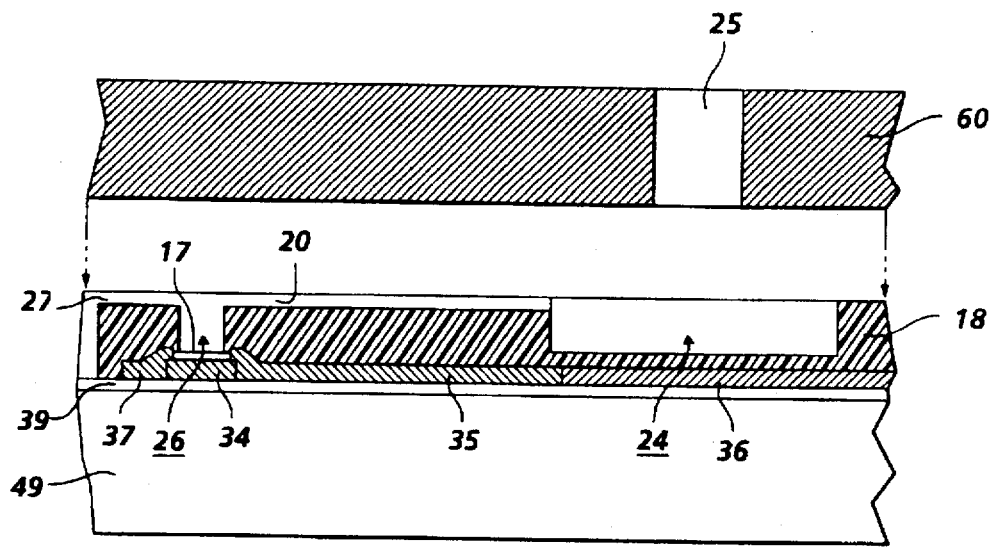
FIG. 6 is the enlarged cross-sectional view of a portion of the heater wafer shown in FIG. 5 showing a portion of the covering substrate separated therefrom the heater wafer.
Figure 7:
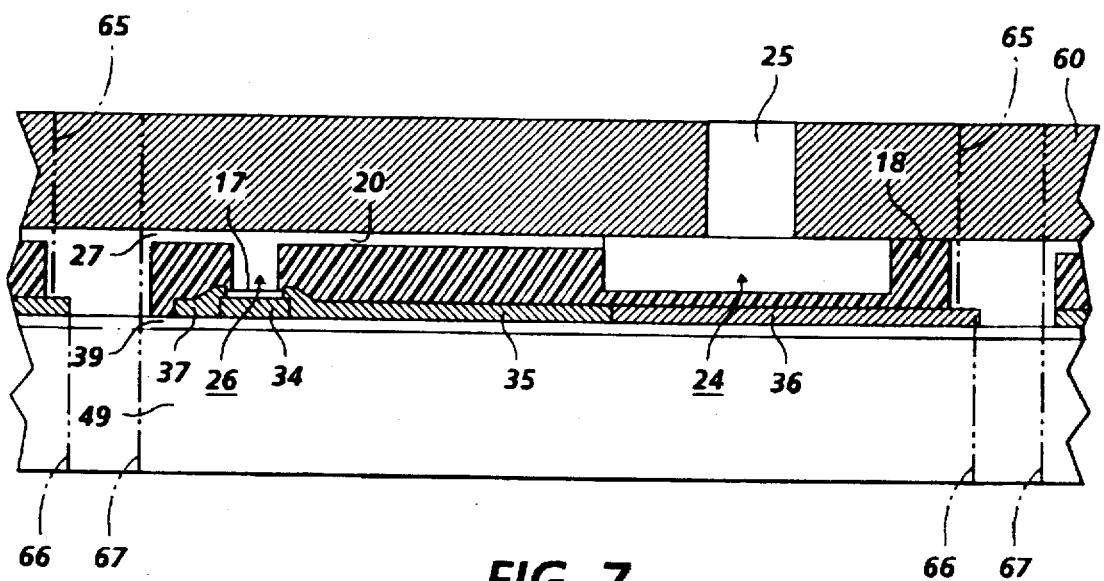
FIG. 7 shows an enlarged cross-sectional view of a portion of an aligned and bonded covering substrate and heater wafer prior to dicing into a plurality of individual printheads, one of which is shown in FIG. 1.

In FIG. 6, subsequent to forming ink flow directing structures integrally on heater wafer 49, glass or other insulative substrate 60 is mated with and bonded to heater wafer 49 to cover the recess reservoir 24 and channels 20. Glass substrate 60 has etched ink fill hole 25, which feeds ink to reservoir 24 from a supply of ink (not shown) under a negative pressure. In FIG. 7 bonded glass substrate 60 and heater wafer 49 are severed into a plurality of printheads (one of which is shown in FIGS. 1 and 3) by a dicing blade (not shown) along dicing lines 65, 66, and 67, thereby forming individual printheads.

Figure 8:
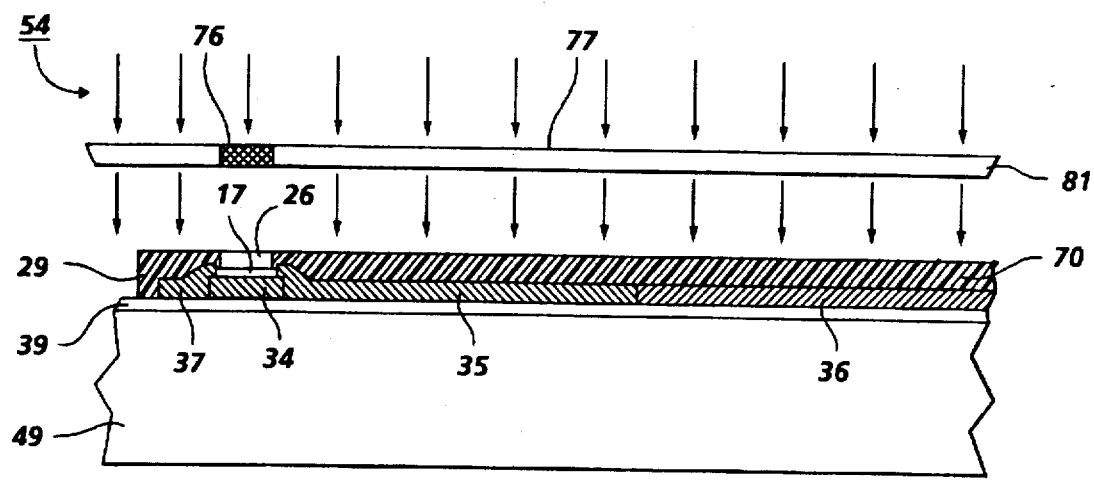
FIG. 8 is a partially fabricated alternate embodiment of the present invention, showing an enlarged cross-sectional view of a portion of the heater wafer having a first layer of negative acting positive photoresist patterned by a non-graded mask and then developed to form the heater pits therein.
Figure 9:
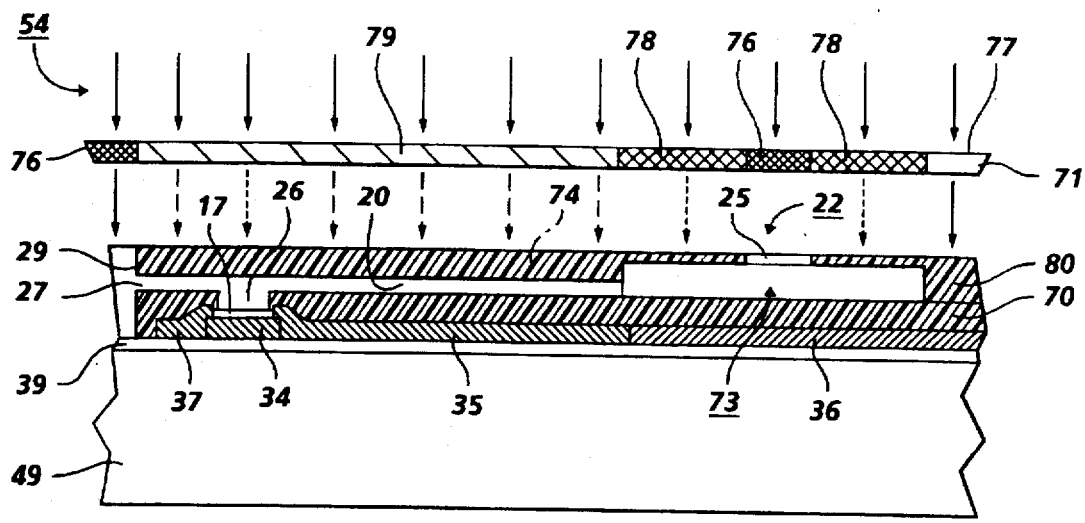
FIG. 9 is a fully fabricated alternate embodiment of the present invention, showing an enlarged cross-sectional view of a portion of the heater wafer having a second layer of negative acting positive photoresist patterned by a graded mask and then developed.

In an alternative embodiment shown in FIGS. 8 and 9, two layers of negative acting positive photoresist 70, 80 are substituted for the aforementioned positive photoresist 18. The advantage of negative acting positive resist is its property of reentrant or sloping walls, which tend to prevent sharp edges. A further advantage of a negative acting positive resists is that the such resists retain the high resolution of positive resists while having the imaging properties of negative photoresist or polyimide. A negative acting positive resist, also referred to as an acid hardening resist, is produced, for example, by the addition of Cymel 303®, to a positive resist such as Shipley 1475®. Similar to the method set forth in the preferred embodiment using the positive resist 18, multiple layers of negative acting positive photoresist 70 are applied to the heater wafer 49 until a thickness of 10–20 microns is achieved. Referring to FIG. 8, a non-graded mask 81 having opaque areas 76 for the heater pits 26 and the rest of the mask 81 is clear or transparent area 77 to permit UV light 54 to pass unimpeded therethrough to form latent images of the pits 26 in the photoresist 70. The exposure to UV light causes the exposed portions to be soluble in developer. The exposed photoresist 70 is heated at 100° C. for about 10 minutes and then cooled to ambient temperature. This heating and cooling step causes a reaction which renders the exposed portion of the negative acting positive photoresist 70 to become insoluble in developer. Subsequently, a blanket exposure with UV light causes all previously unexposed regions to become soluble in developer; namely, the photoresist over the heating element. The wafer is inserted in a developer, such as KTI 809® to remove all soluble photoresist 70 (i.e., heater pits 26).

In FIG. 9, a second multilayered negative acting positive photoresist layer 80 is applied over the photoresist layer 70 and heater pits 26 to a thickness of 20–35 microns. Wafer 49 is then aligned with a graded mask 71 to form a latent image of varying profile levels, and then the negative acting positive photoresist layer 80 is exposed to UV light 54, thereby patterning a latent image of an ink flow directing structure 22 comprising ink channels 20 and ink reservoir 73 with inlet 25. The exposed negative acting positive photoresist will become insoluble in a developer, as discussed later, while the unexposed regions remain soluble in the developer. Thus, the opaque areas 76 in graded mask 71 will cause the photoresist 80 to be removed by the developer. Variable areas 78 and 79 in the graded mask permits a smaller percentage of UV light transmission to reach the photoresist 80 and control the depth of the UV light penetration into the photoresist thereby provides photoresist 80 with a profile having a varying depth. Graded or variable area 78 limits the transmission of UV light more than in area 79, so that the depth of reaction in the photo resist 80 is less under area 78 than under area 79. After creating the latent image in photoresist layer 80, the photoresist is baked at about 100° C. for around ten minutes to reduce its solubility, since exposed negative acting positive resist is rendered soluble in developer. Heating after exposure causes the exposed portion of the negative acting positive resist to react rendering it insoluble in developer. After cooling, the baked photoresist 80 is exposed to a blanket exposure of UV light in order that initially unexposed regions become soluble in developer. After photoresist 80 is blanket exposed to UV light, the wafer is immersed in developer, such as KTI 809® to develop away all soluble regions of photoresist 80 and thereby forming ink flow directing structure 22 comprising heater pits 26, ink reservoir 73, ink inlet 25, and ink channels 20. The ink channels have nozzles 27 at one end and the opposite ends connect to the ink reservoir. After developing and removing the soluble portion of the photoresist 70, 80 to form the ink flow directing structure 22, the wafer 49 is baked at 300° C.–400° C. for about 1 hour to permanently set the two developed and cured layers of photoresist 70, 80 and insure adequate thermal stability. Although the alternate embodiment shown in FIGS. 8 and 9 requires the processing of two separate layers of photoresist 70, 80, the cover plate 31 with ink inlets is eliminated, for the second photoresist layer 80 integrally provides the ink inlets 25.

Figure 10:
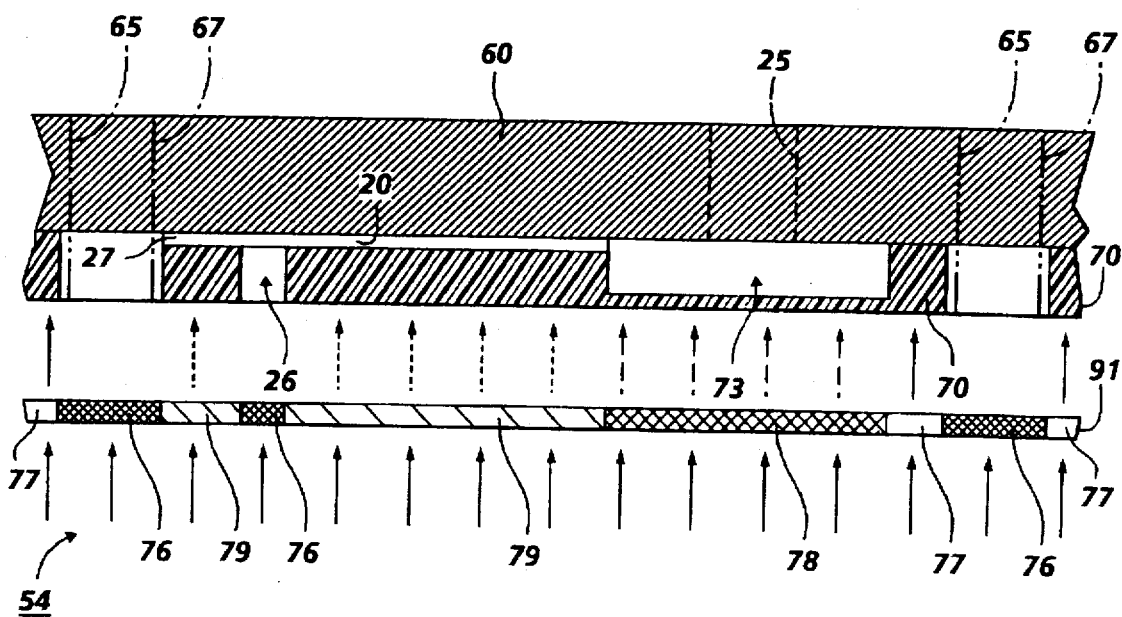
FIG. 10 is another embodiment of the present invention.

Another embodiment is shown in FIG. 10, wherein a single negative acting positive photoresist layer 70 is deposited on a cover plate 60 to a thickness of 30 to 35 µm. The photoresist 70 is exposed to UV light 54 through graded mask 91 having opaque areas 76 for subsequent total removal of the photoresist, and two different areas of reduced light transmission or filtering, one reducing the passage of UV light more than the other. The least amount of light passed is through mask region 78 to produce the reservoir 73, and the region of the mask 91 which passes substantially more UV light to produce the ink channels 20 is region 79. the borders of each printhead are thus bonded by solid region 76 of the graded mask 91 and the heater pits 26 are formed by opaque region 76. The same process of UV exposure through a mask, heating, cooling, blanket exposure to UV, insertion in a developer such as KTI 809®, and final baking to set the patterned ink flow directing structure 22 is used as was described above with respect to the embodiment in FIG. 9. Inlet 25 is shown in dashed line and is either etched by use of a patterned photoresist (not shown) deposited on the surface of the cover plate 60 opposite the surface with photoresist 70 or may be drilled therethrough after the final baking step for the negative acting positive photoresist layer 70. If the cover plate 60 is transparent, the photoresist may be additionally patterned by a graded mask (not shown) through the cover plate. Negative acting positive photoresist 70 is aligned and bonded to the heater wafer 4a, (not shown) in FIG. 10. The plurality of individual printheads 10 are obtained by separating the bonded cover plate and heater wafer along cut lines 65 and 67 by, for example, a dicing operation.

The invention had been described with reference to the preferred embodiments thereof, which are illustrative and not limiting. Various changes may be made without departing from the spirit and scope of the invention as defined in the appended claims.

I claim:

1. A method of fabricating a thermal ink jet printhead, comprising the steps of:

(a) providing a silicon wafer having on one surface thereof a plurality of arrays of heating elements, drivers, and logic circuitry for selectively addressing the heating elements with electrical pulses;

(b) applying a first layer of negative-acting photoresist on the surface of the silicon wafer containing the heating elements, drivers, and logic circuitry;

(c) exposing said first photoresist layer to UV light through a non-graded mask having opaque areas and clear areas thereby causing exposed portions of the layer to be soluble in developer;

(d) heating the first photoresist layer until said exposed portions are insoluble in developer;

(e) blanket exposing the first photoresist layer to UV light causing previously unexposed portions to become soluble in developer;

(f) developing said first photoresist layer to remove all soluble photoresist forming heater pits in said wafer;

(g) applying a second layer of negative-acting photoresist on said developed first layer;

(h) exposing said second photoresist layer to UV light through a graded mask having opaque, clear and variable areas thereby creating a latent image at the layer surface;

(i) heating the layer until the portions under the clear and variable areas are partially insoluble, respectively, in developer;

(j) blanket exposing the second photoresist layer to UV light causing previously unexposed areas to become soluble in developer;

(k) developing said second photoresist layer to remove all soluble photoresist thereby forming channel recesses of various depths, (l) bonding a flat substrate having a plurality of through holes therein to the developed photoresist layer on the silicon wafer, said bonding step encapsulating said channel recess structures formed integrally on said silicon wafer and forming the thermal ink jet printheads; and (m) dicing the developed photoresist layer and flat substrate into a plurality of individual printheads.

* * * * *